(12) United States Patent
Hu (10) Patent No.: US 11,546,985 B2
(45) Date of Patent: Jan. 3, 2023

(54) DIFFERENTIAL SIGNAL ROUTING LINE OF CIRCUIT BOARD AND CIRCUIT BOARD

(71) Applicant: HKC Corporation Limited, Shenzhen (CN)

(72) Inventor: Shuixiu Hu, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/982,028

(22) PCT Filed: Nov. 14, 2018

(86) PCT No.: PCT/CN2018/115321
§ 371 (c)(1),
(2) Date: Sep. 17, 2020

(87) PCT Pub. No.: WO2020/082446
PCT Pub. Date: Apr. 30, 2020

(65) Prior Publication Data
US 2021/0022241 A1    Jan. 21, 2021

(30) Foreign Application Priority Data
Oct. 23, 2018  (CN) .......................... 201811234265.2

(51) Int. Cl.
*H05K 1/02* (2006.01)
*H05K 1/03* (2006.01)
*H05K 1/18* (2006.01)
*H05K 1/11* (2006.01)

(52) U.S. Cl.
CPC ......... *H05K 1/0245* (2013.01); *H05K 1/0219* (2013.01); *H05K 1/0228* (2013.01); *H05K 1/0393* (2013.01); *H05K 1/115* (2013.01); *H05K 1/18* (2013.01); *H05K 1/025* (2013.01); *H05K 1/111* (2013.01)

(58) Field of Classification Search
CPC .. H05K 1/0245; H05K 1/0219; H05K 1/0228; H05K 1/115; H05K 2201/09672
See application file for complete search history.

(56) References Cited

U.S. PATENT DOCUMENTS

| 6,425,767 | B1 |   | 7/2002 | Lin |
| 7,427,719 | B2 | * | 9/2008 | Liang ................... H05K 1/0245 |
|           |    |   |        | 174/255 |
| 7,916,494 | B1 | * | 3/2011 | Chen .................... H05K 1/0233 |
|           |    |   |        | 361/760 |

(Continued)

FOREIGN PATENT DOCUMENTS

| CN | 101064992 A | 10/2007 |
| CN | 101378618 A | 3/2009 |

(Continued)

OTHER PUBLICATIONS

Zhongtang Zhou, the International Search Report, dated Jun. 2019, CN.

*Primary Examiner* — Ishwarbhai B Patel (57) ABSTRACT

The present application discloses a differential signal routing line of a circuit board and a circuit board, which comprises a circuit board, and the circuit board is provided with differential signal routing lines including a first differential signal routing line and a second differential signal routing line that are disposed at different layers of the circuit board.

6 Claims, 5 Drawing Sheets

(56) References Cited

U.S. PATENT DOCUMENTS

| | | | | |
|---|---|---|---|---|
| 9,655,231 | B2* | 5/2017 | Hidaka | ............... H05K 1/0313 |
| 2005/0139864 | A1* | 6/2005 | Chang | ............... H01L 23/49822 |
| | | | | 257/200 |
| 2005/0201065 | A1* | 9/2005 | Regnier | ............... H05K 1/0251 |
| | | | | 361/720 |
| 2009/0056983 | A1* | 3/2009 | Liu | ............... H05K 1/0245 |
| | | | | 174/255 |
| 2009/0065238 | A1* | 3/2009 | Liu | ............... H05K 1/0245 |
| | | | | 174/250 |
| 2017/0019145 | A1* | 1/2017 | Mutnury | ............... H01P 3/08 |
| 2020/0380902 | A1* | 12/2020 | Chen | ............... G09G 5/006 |

FOREIGN PATENT DOCUMENTS

| | | |
|---|---|---|
| CN | 101674704 A | 3/2010 |
| CN | 102065631 A | 5/2011 |
| CN | 104244574 A | 12/2014 |

\* cited by examiner

DIFFERENTIAL SIGNAL ROUTING LINE OF CIRCUIT BOARD AND CIRCUIT BOARD

CROSS REFERENCE OF RELATED APPLICATIONS

The present application claims priority to the Chinese Patent Application No. CN201811234265.2, filed to the Chinese Patent Office on Oct. 23, 2018, and entitled "DIFFERENTIAL ROUTING LINES OF CIRCUIT BOARD AND CIRCUIT BOARD", which is incorporated herein by reference in its entirety.

TECHNICAL FIELD

The present application relates to a circuit board, and particularly to differential routing lines of a circuit board and a circuit board.

BACKGROUND

The statements here merely provide background information related to the present application and does not necessarily constitute prior art.

Differential routing lines are a pair of transmission lines mutually coupled with each other, and are widely applied in computer bus and Ethernet devices. The differential routing lines transmit differential signals, with one line carrying the signal and the other carrying a compensation signal thereof, and a receiving end determines the received signals by comparing a difference value between the two signals. Differential signals are less subjected to interference of noise of a switch when transmitted in the differential routing lines.

In the board industry, an output differential signal is output to a rear end through the differential routing lines during layout of a circuit board, and each pair of differential routing lines has two lines that are arranged in parallel.

The differential routing lines of the circuit board occupy a large area, and therefore the utilization rate of the circuit board is low and the cost is high.

SUMMARY

The present application provides differential routing lines of a circuit board and a circuit board, so as to reduce the area occupied by the differential routing lines and improve the utilization rate of the circuit board.

An objective of the present application is achieved through following technical solutions.

The present application discloses differential routing lines of a circuit board, and the circuit board includes at least two layers; at least one pair of differential routing lines is disposed on the circuit board; each pair of the differential routing lines includes a first differential routing line and a second differential routing line; and the first differential routing line and the second differential routing line are disposed at different layers of the circuit board.

Optionally, the first differential routing line and the second differential routing line are disposed at two adjacent layers of the circuit board respectively.

In this solution, the first differential routing line and the second differential routing line are disposed at two adjacent layers of the circuit board respectively, where the first differential routing line and the second differential routing line have a smaller distance but stronger coupling there between, as compared with that the first differential routing line and the second differential routing line are disposed at two non-adjacent layers of the circuit board respectively, and thus, the possibility of electromagnetic interference (EMI) is small, and the immunity to noise is improved.

Optionally, the first differential routing line is disposed right above or below the second differential routing line.

Optionally, the circuit board has four layers, where the first differential routing line is disposed at the second layer, and the second differential routing line is disposed at the third layer.

Optionally, the first differential routing line has the same routing path as the second differential routing line, and the first differential routing line and the second differential routing line have the same interval.

Optionally, the first differential routing line and the second differential routing line are set as straight lines.

Optionally, the circuit board has four layers and a plurality pairs of differential routing lines are provided, where a half of the differential routing lines have first differential routing lines thereof disposed at the first layer and second differential routing lines thereof disposed at the second layer, and the other half of the differential routing lines have the first differential routing lines thereof disposed at the third layer and the second differential routing lines thereof disposed at the forth layer.

Optionally, the number of layers of the circuit board is more than four, and the first differential routing line and the second differential routing line are disposed at different layers of the circuit board respectively.

Optionally, the circuit board includes a control chip and a connector (CNT), where one end of the first differential routing line and second differential routing line is connected to the control chip, and the other end is connected to the connector (CNT), and differential signals of the control chip are transmitted to the connector through the first differential routing line and the second differential routing line. The control chip may include a timing controller (TCON) or the like.

Another objective of the present application is to provide a circuit board, where the circuit board is a multilayer board, and the circuit board includes differential routing lines that include a first differential routing line and a second differential routing line; and the first differential routing line and the second differential routing line are disposed at two different layers of the circuit board respectively.

Another objective of the present application is to provide differential routing lines of a circuit board, where the circuit board is a four-layer board; the circuit board includes a control chip, a connector, and four pairs of differential routing lines, each pair of which includes a first differential routing line and a second differential routing line; the first differential routing line is disposed at the second layer of the circuit board, and the second differential routing line is disposed at the third layer; one end of the first differential routing line and second differential routing line is connected to the control chip, and the other end is connected to the connector, and differential signals of the control chip are transmitted to the connector through the first differential routing line and the second differential routing line.

Another objective of the present application is to provide a manufacture method for a circuit board, where the circuit board is a multilayer board, and the circuit board includes a control chip, differential routing lines, and a connector, where the differential routing lines include a first differential routing line and a second differential routing line.

The manufacture method includes:

forming a first differential routing line at one layer of the circuit board;

forming a second differential routing line at another layer of the circuit board;

forming a control chip on the circuit board; and connecting the first differential routing line and the second differential routing line to the control chip and the connector.

In a circuit board, if the first differential routing line and the second differential routing line are disposed at the same layer, the area occupied by the differential routing lines includes the area of the first and second differential routing lines, the area between the first and second differential routing lines, and the area between every two pairs of the differential routing lines. Such configuration may occupy a large area, and therefore the utilization rate of the circuit board is low and the cost is high. In this solution, the first differential routing line and the second differential routing line are disposed at two different layers of the circuit board, which can save the area between the first differential routing line and the second differential routing line, and further save a half of the area between every two pairs of the differential routing lines at the same layer, so as to reduce the area occupied by the differential routing lines, improve the utilization rate of the circuit board, and reduce the cost.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present invention will be further described in detail below in conjunction with the accompanying drawings and embodiments.

Differential routing lines of a circuit board, which occupy a small area and improve the utilization rate of the circuit board, and a circuit board according to an embodiment of the present application will be described below in detail with reference to FIGS. 1-7.

Figure 1:
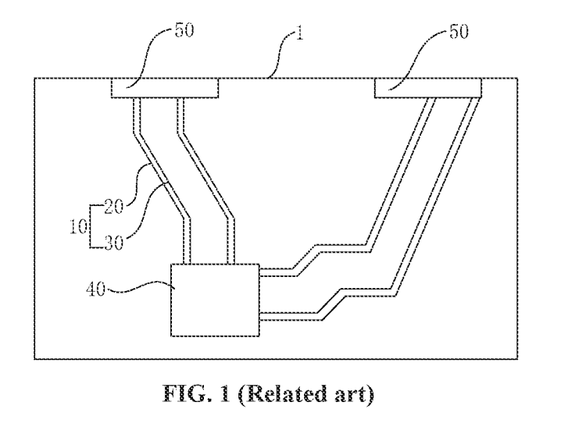
FIG. 1 is a structural diagram illustrating undisclosed differential routing lines.

FIG. 1 is a schematic diagram illustrating differential routing lines of a circuit board that have not been disclosed. In particular, the circuit board 1 is of a single layer, and at least one pair of differential routing lines 10 is disposed on the circuit board 1. Each pair of differential routing lines 10 includes a first differential routing line 20 and a second differential routing line 30, which are arranged side by side on the same single layer.

In some embodiments, the circuit board 1 may further include a control chip 40, where one end of the first differential routing line 20 and one end of the second differential routing line 30 are each connected to the control chip 40, and the other ends are connected to the connector (CNT) 50. Differential signals of the control chip 40 are transmitted to the connector 50 through the first differential routing line 20 and the second differential routing line 30. The control chip may include a timing controller (TCON) or the like.

Figure 2:
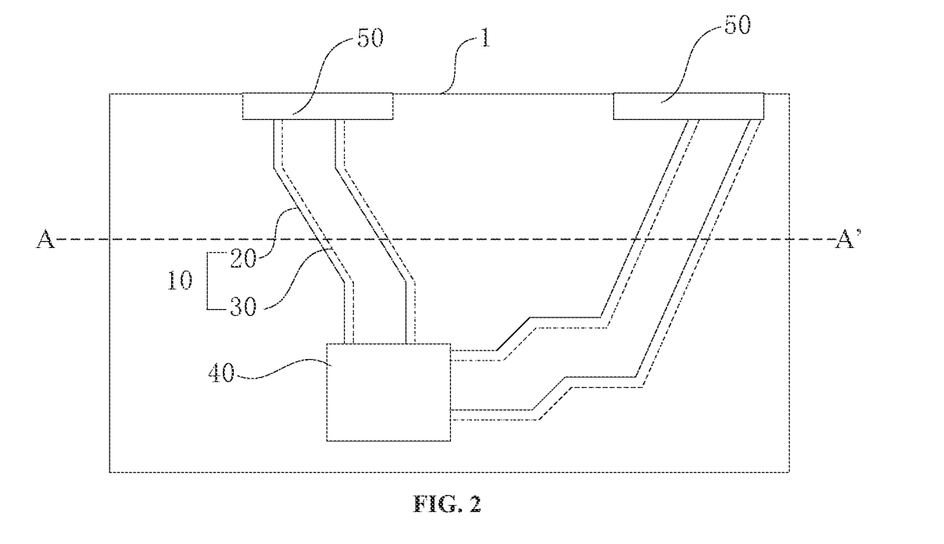
FIG. 2 is a structural diagram illustrating that a first differential routing line is disposed at a second layer according to an embodiment of the present application.
Figure 3:
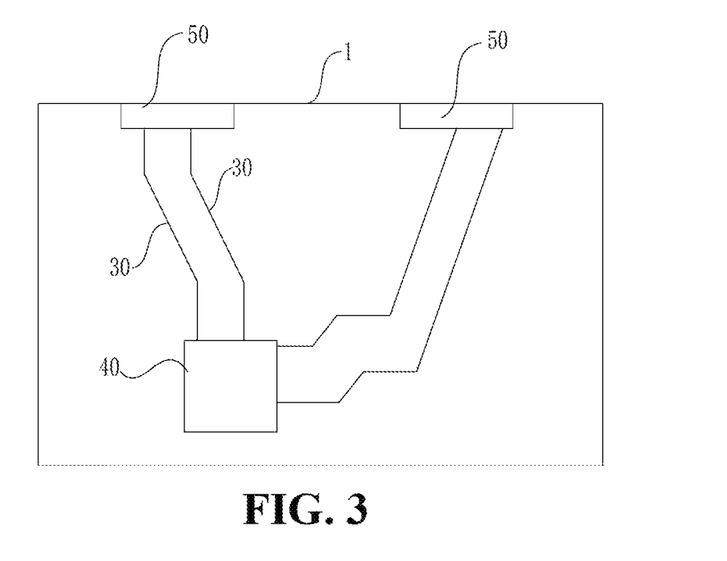
FIG. 3 is a structural diagram illustrating that a second differential routing line is disposed at a third layer according to an embodiment of the present application.

Referring to FIGS. 2 and 3, this embodiment discloses differential routing lines of a circuit board, and the circuit board 1 has at least two layers; at least one pair of differential routing lines 10 is provided and disposed on the circuit board 1; each pair of the differential routing lines includes a first differential routing line 20 and a second differential routing line 30; and the first differential routing line 20 and the second differential routing line 30 are disposed at different layers of the circuit board 1.

In a technical solution where the first differential routing line 20 and the second differential routing line 30 of the circuit board 1 are disposed at the same layer, the area occupied by the differential routing lines 10 includes the area of the first routing line 20 and second differential routing line 30, the area between the first routing line 20 and second differential routing line 30, and the area between every two pairs of the differential routing lines. Such configuration may occupy a large area, and thereby the utilization rate of the circuit board 1 is low and the cost is high. In this solution, the first differential routing line 20 and the second differential routing line 30 are disposed at two different layers of the circuit board 1, which can save the area between the first routing line 20 and second differential routing line 30, and further save a half of the area between every two pairs of the differential routing lines at the same layer, so as to reduce the area occupied by the differential routing lines 10, improve the utilization rate of the circuit board 1, and reduce the cost.

In an embodiment, the difference from the above embodiment is that, referring to FIGS. 2 and 3, the first differential routing line 20 and the second differential routing line 30 are disposed at two adjacent layers of the circuit board 1 respectively.

In this solution, the first differential routing line 20 and the second differential routing line 30 are disposed at two adjacent layers of the circuit board 1 respectively, such that the first differential routing line 20 and the second differential routing line 30 have a smaller distance but stronger coupling there between, as compared with that the first differential routing line 20 and the second differential routing line 30 are respectively disposed at two non-adjacent layers of the circuit board 1, and thus, the possibility of electromagnetic interference (EMI) is small, and the immunity to noise is improved.

Figure 8:
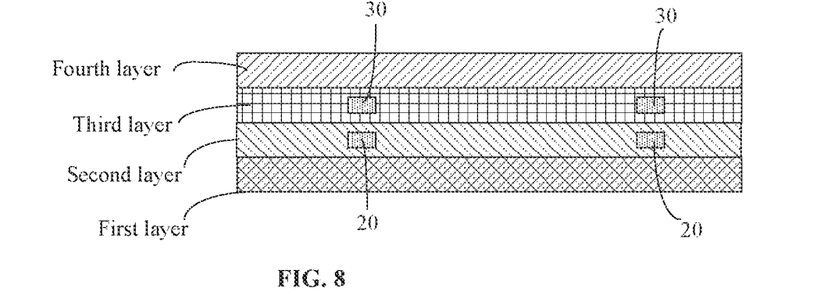
FIG. 8 is a cross-sectional view of the circuit board 1 taken alone line AA' shown in FIG. 2 according to an embodiment of the present disclosure.

Optionally, in further connection with FIG. 8, the first differential routing lire 20 is disposed right above or below the second differential routing line 30. The circuit board 1 has four layers, where the first differential routing line 20 is disposed at the second layer, and the second differential routing line 30 is disposed at the third layer.

In this solution, the first differential routing line 20 is disposed right above or below the second differential routing line 30, such that the first differential routing line 20 and the second differential routing line 30 have a smaller distance but stronger coupling there between, and thus, the possibility of electromagnetic interference (EMI) is small, and the immunity to noise is improved.

In this solution, the first differential routing line 20 is disposed at the second layer, and the second differential routing line 30 is disposed at the third layer. The coupling of the equivalent RC impedance for each pair of the differential routing lines is substantially equal, and at the same time the utilization rate of the printed circuit board 1 is also improved. The first differential routing line 20 is disposed at the second layer, and the second differential routing line is disposed at the third layer, so that the first differential routing line 20 and the second differential line 30 are not exposed to the surface and thereby does not oxidize and age easily.

Figure 4:
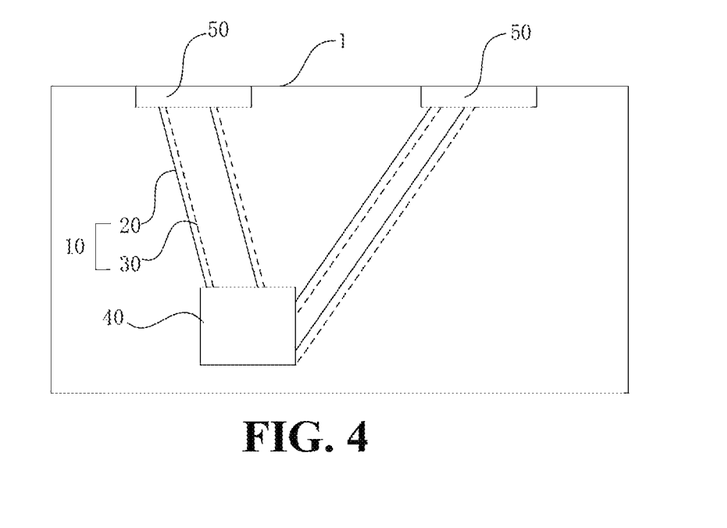
FIG. 4 is a structural diagram illustrating that a first differential routing line and a second differential routing line are straight lines according to an embodiment of the present application.

Optionally, referring to FIG. 4, the first differential routing line 20 has the same routing path as the second differential routing line 30, and the first differential routing line 20 and the second differential routing line 30 have the same interval. The first differential routing line 20 and the second differential routing line 30 are set as straight lines.

In this solution, the first differential routing line 20 has the same routing path as the second differential routing line 30, and the first differential routing line 20 and the second differential routing line 30 have the same interval; the impedance is continuous along the first differential routing line 20 and the second differential routing line 30 and is kept constant, and the first differential routing line 20 and the second differential routing line 30 have a strong anti-interference capability.

In this solution, the first differential routing line 20 and the second differential routing line 30 are set as straight lines; during the routing process, the first differential routing line 20 and the second differential routing line 30 are not bent, the routing arrangement is simple, and a length error between the first differential routing line 20 and the second differential routing line 30 is small; thus, the first differential routing line 20 and the second differential routing line 30 are almost the same, the impedance is more easily continuous along the first differential routing line 20 and the second differential routing line 30 and is kept constant, and the first differential routing line 20 and the second differential routing line 30 have a strong anti-interference capability.

Optionally, referring to FIG. 2, the circuit board 1 includes a control chip 40, where one end of the first differential routing line 20 and one end of the second differential routing line 30 are connected to the control chip 40, and the other ends are connected to the connector (CNT) 50; differential signals of the control chip 40 are transmitted to the connector 50 through the first differential routing line 20 and the second differential routing line 30. The control chip may include a timing controller (TCON) or the like.

In this solution, the first differential routing line 20 and the second differential routing line 30 are connected to the control chip 40, and the signals received by the first differential routing line 20 and second differential routing line 30 are precise; the control chip 40 is small in size, which can further save the space of the circuit board 1, and therefore improve the utilization rate of the circuit board 1.

Figure 5:
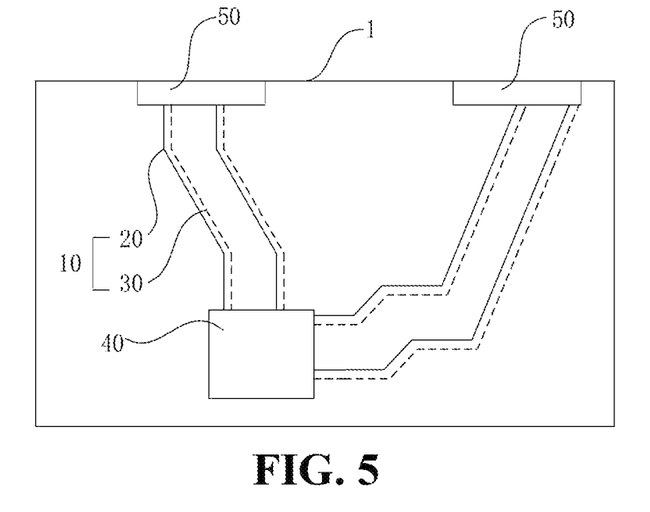
FIG. 5 is a structural diagram illustrating that a first differential routing line is disposed at a third layer according to an embodiment of the present application.
Figure 6:
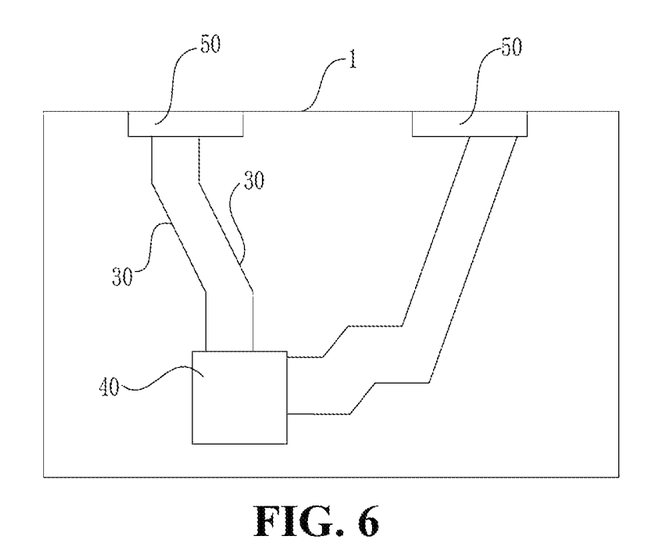
FIG. 6 is a structural diagram illustrating that a second differential routing line is disposed at a forth layer according to an embodiment of the present application.
Figure 9:
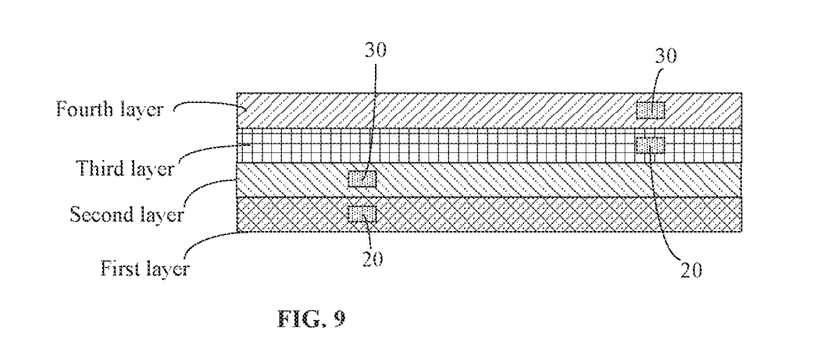
FIG. 9 is a cross-sectional view of the circuit board 1 taken alone line AN shown in FIG. 2 according to another embodiment of the present disclosure.

In an embodiment, referring to FIGS. 5 and 6 and in further connection with FIG. 9, the difference from the above embodiment is that the circuit board 1 has four layers and a plurality pairs of differential routing lines 10 are provided, where a half of the differential routing lines 10 have first differential routing line 20 thereof disposed at the first layer and second differential routing lines 30 thereof disposed at the second layer, and the other half of the differential routing lines 10 have first differential routing lines 20 thereof disposed at the third layer and second differential routing line 30 thereof disposed at the forth layer.

In this solution, a plurality pairs of differential routing lines 10 are provided, where a half of the differential routing lines 10 have differential routing lines 20 thereof disposed at the first layer and second differential routing lines 30 thereof disposed at the second layer, and the other half of the differential routing lines have first differential routing lines 20 thereof disposed at the third layer and second differential routing lines 30 thereof disposed at the forth layer; the differential routing lines 10 are evenly distributed in each layer of the circuit board 1, such that the space of each layer of the circuit board 1 can be used more reasonably; in addition, the differential routing lines 10 are not disposed collectively in two of the layers, which results in that the remaining space of the two layers is small while the space of the other two layers is underutilized.

In an embodiment, the difference from the above embodiment is that the number of layers of the circuit board 1 is a plurality more than four, and the first differential routing line 20 and the second differential routing line 30 are disposed at different layers of the plurality of layers of the circuit board 1 respectively.

In this solution, the number of layers of the circuit board 1 is more than four, and since the circuit board 1 has a plurality of layers, there may be a plurality of options for routing arrangement of the first differential routing line 20 and second differential routing line 30, which may make the routing arrangement more convenient and more reasonable.

Another embodiment of the present application discloses a circuit board 1, and referring to FIGS. 2 and 3, the circuit board 1 is a multilayer board; the circuit board 1 includes differential routing lines 10 that include a first differential routing line 20 and a second differential routing line 30; where the first differential routing line 20 and the second differential routing line 30 are disposed at two different layers of the circuit board 1 respectively.

In this solution, the first differential routing line 20 and the second differential routing line 30 are disposed at two different layers of the circuit board 1, which can save the area between the first differential routing line 20 and the second differential routing line 30, and can save a half of the area between every two pairs of the differential routing lines at the same layer, there by reducing the area occupied by the differential routing lines 10, improving the utilization rate of the circuit board 1, and reducing the cost.

Another embodiment of the present application discloses differential routing lines of a circuit board 1, and referring to FIGS. 2 and 3, the circuit board 1 is a four-layer board; the circuit board 1 includes a control chip 40, a connector 50, and four pairs of differential routing lines 10, each pair of which includes a first differential routing line 20 and a second differential routing line 30; the first differential routing line 20 is disposed at the second layer of the circuit board 1, and the second differential routing line 30 is disposed at the third layer; one end of the first differential routing line 20 and one end of the second differential routing line 30 are connected to the control chip 40, and the other ends are connected to the connector 50, and differential signals of the control chip 40 are transmitted to the connector 50 through the first differential routing line 20 and the second differential routing line 30.

In this solution, the control chip may include a timing controller (ICON) or the like. The first differential routing line 20 and the second differential routing line 30 are disposed at the second layer and third layer of the circuit board 1 respectively, which can save the area between the first differential routing line 20 and second differential routing line 30, and can save the area between every two pairs of the differential routing line, there by reducing the area occupied by the differential routing lines 10, improving the utilization rate of the circuit board 1, and reducing the cost. The first differential routing line 20 and the second differential routing line 30 are respectively disposed at the second and third layers of the circuit board 1, which may ensure that equivalent resistance-capacitance (RC) coupling of each pair of the differential routing lines is substantially equal, such that the coupling between the first differential routing line 20 and the second differential routing line 30 is stronger, the possibility of electromagnetic interference (EMI) is small, and the immunity to noise is improved.

Figure 7:
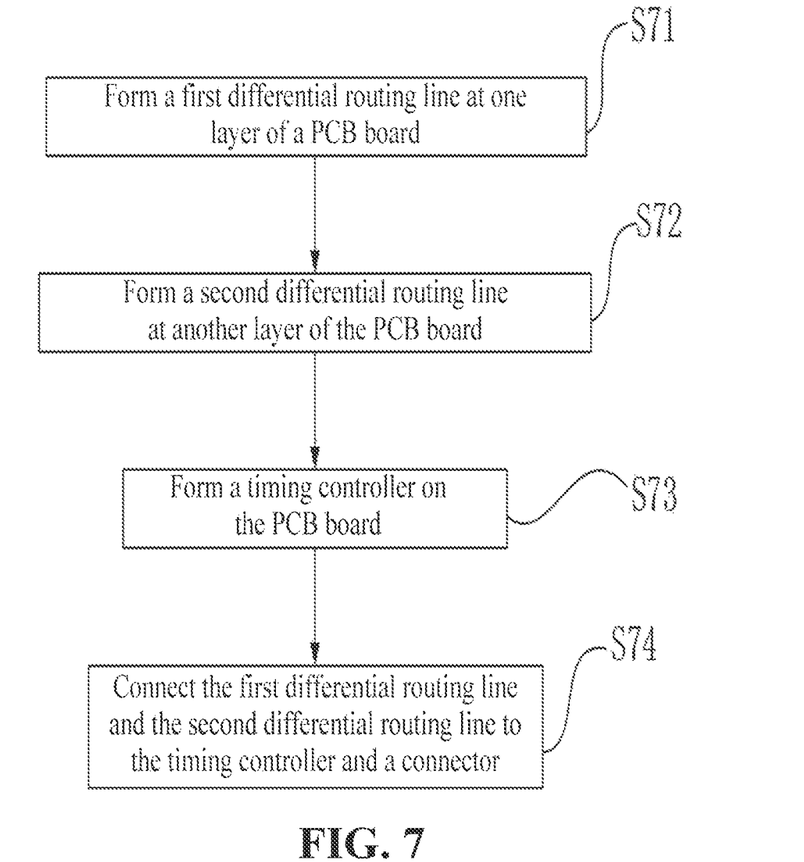
FIG. 7 is a flowchart illustrating manufacture of a circuit board according to embodiments of the present application.

Another embodiment of the present application discloses a manufacture method for a circuit board, and referring to FIG. 7, the circuit board 1 is a multilayer board; the circuit board 1 includes a control chip 40, differential routing lines 10, and a connector 50, where the differential routing lines 10 include a first differential routing line 20 and a second differential routing line 30.

The manufacture method includes:

S71: Form a first differential routing line 20 at one layer of the circuit board 1.

S72: Form a second differential routing line 30 at another layer of the circuit board 1.

S73: Form a control chip 40 on the circuit board 1.

S74: Connect the first differential routing line 20 and the second differential routing line 30 to the control chip 40 and the connector 50.

In this method, the first differential routing line 20 and the second differential routing line 30 may be disposed at two different layers of the circuit board 1, which can save the area between the first differential routing line 20 and the second differential routing line 30, and can save a half of the area between every two pairs of the differential routing lines at the same layer, there by reducing the area occupied by the differential routing lines, improving the utilization rate of the circuit board 1, and reducing the cost.

The circuit board 1 of the present application may include a printed circuit board (PCB), a flexible printed circuit (FPC) or the like, and what is needed is merely application.

Although above contents are detailed further illustration of the present application with reference to specific optional embodiments thereof, it is not intended that the specific implementation of the present application should be limited to these illustrations. For a person of ordinary skill in the art of the present application, on the premise of keeping the conception of the present application, a quantity of simple deductions or replacements can also be made, all of which should be considered as belonging to the protection scope of the present application.

What is claimed is:

1. A circuit board of a display panel comprising differential routing lines, wherein the circuit board has four layers including a first layer, a second layer, a third layer, and a fourth layer that are stacked vertically one over the former in succession, so that the first layer and the fourth layer are disposed on an outer side, relative to the second layer and the third layer that are disposed on an inner side; wherein the circuit board is a four-layer circuit board consisting of the first layer, the second layer, the third layer, and the fourth layer that are stacked together, wherein the first layer and the fourth layer are exposed to an external environment, and wherein the second layer and the third layer are sandwiched between the first layer and the fourth layer and are not exposed to the external environment;

wherein there is disposed at least one pair of differential routing lines in the circuit board, and each pair of the differential routing lines comprises a first differential routing line and a second differential routing line that are disposed at different layers of the circuit board; wherein the first differential routing line are disposed at adjacent layers of the circuit board;

wherein the circuit board further comprises a control chip and a connector that are disposed on the circuit board;

wherein one end of each of the first differential routing line and the second differential routing line of each pair is connected to the control chip, and another end of each of the first differential routing line and the second differential routing of the pair is connected to the connector, wherein the first differential routing line and the second differential routing line of each pair are configured to transmit differential signals from the control chip to the connector;

wherein the control chip is a timing controller;

wherein the circuit board is of a rectangular shape;

wherein the control chip is disposed at a position adjacent to a first long side of the circuit board, and there are disposed two connectors at a second long side of the circuit board opposite to the first long side, the two connectors including a first connector and a second connector;

wherein a first pair of differential routing lines is connected between the timing controller and the first connector, and a second pair of differential routing lines is connected between the timing controller and the second connector;

wherein one end of each of the first differential routing line and the second differential routing line of the first pair is led out of a side of the timing controller parallel to the first and second long sides of the circuit board, and another end of each of the first differential routing line and the second differential routing line of the first pair is led into a side of the first connector parallel to the first and second long sides of the circuit board; wherein one end of each of the first differential routing line and the second differential routing line of the second pair is led out of another side of the timing controller parallel to short sides of the circuit board, and another end of each of the first differential routing line and the second differential routing line of the second pair is led into a side of the second connector parallel to the first and second long sides of the circuit board, wherein the first long side is a lower side and the second long side is an upper side, and wherein the first connector is disposed left to the second connector.

2. The circuit board according to claim 1, wherein each of the first differential routing line and the second differential routing line of the first pair consists of a first line segment, a second line segment and a third line segment that are sequentially connected, wherein both the first line segment and the third line segment are parallel to short sides of the circuit board and are connected to the timing controller and the first connector, respectively, and the second line segment is disposed obliquely relative to the first and third line segments and is connected between the first and third line segment;

wherein each of the first differential routing line and the second differential routing line of the second pair consists of a first line segment, a second line segment, a third line segment, and a fourth line segment that are sequentially connected, wherein the first line segment and the fourth line segment are connected to the timing controller and the second connector, respectively, wherein the first line segment and the third line segment are both parallel to long sides of the circuit board, and wherein the second line segment and the fourth line segment are disposed obliquely with respect to the long sides of the circuit board;

wherein the second line segment of each of the first differential routing line and the second differential routing line of the first pair is inclined in a direction of nearing a left short side of the circuit board when measured in a direction starting from an end nearer to the timing controller, and wherein the second line segment and the fourth line segment of each of the first differential routing line and the second differential routing line of the second pair are each inclined in a direction of nearing a right short side of the circuit board when measured in a direction starting from an end nearer to the timing controller.

3. The circuit board according to claim 1, wherein in each pair the first differential routing line is disposed right below or above the second differential line.

4. The circuit board according to claim 1, wherein of each pair, the first differential routing line is disposed at the second layer, and the second differential routing line is disposed at the third layer.

5. The circuit board according to claim 1, wherein the circuit board comprises a plurality of pairs of differential routing lines, wherein of each pair in a half of the plurality pairs of differential routing lines, the first differential routing line is disposed at the first layer and the second differential routing line is disposed at the second layer, wherein of each pair in the other half of the plurality of pairs of differential routing lines, the first differential routing line is disposed at the third layer, and the second differential routing line is disposed at the fourth layer.

6. The circuit board according to claim 1, wherein the circuit board is a flexible circuit board.

* * * * *